(12) United States Patent
Schwindt

(10) Patent No.: US 6,232,789 B1
(45) Date of Patent: *May 15, 2001

(54) PROBE HOLDER FOR LOW CURRENT MEASUREMENTS

(75) Inventor: Randy Schwindt, New Milford, CT (US)

(73) Assignee: Cascade Microtech, Inc., Beaverton, OR (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/864,287

(22) Filed: May 28, 1997

(51) Int. Cl.7 ...................................................... G01R 1/06
(52) U.S. Cl. ............................................ 324/754; 324/762
(58) Field of Search .................................... 324/754, 755, 324/761, 762, 72.5; 439/482, 824; 333/246, 248; 174/68.1, 72 R, 103, 107, 36

(56) References Cited

U.S. PATENT DOCUMENTS

| | | | |
|---|---|---|---|
| 3,648,169 | * 3/1972 | Wiesler | 324/762 |
| 3,930,809 | * 1/1976 | Evans | 324/762 |
| 4,001,685 | 1/1977 | Roch | 324/158 P |
| 4,035,723 | 7/1977 | Kvaternik | 324/158 P |
| 4,116,523 | * 9/1978 | Coberly et al. | 324/754 |
| 4,151,465 | 4/1979 | Lenz | 324/158 P |
| 4,161,692 | 7/1979 | Tarzwell | 324/158 P |
| 4,480,223 | 10/1984 | Aigo | 324/158 P |
| 4,783,625 | 11/1988 | Harry et al. | 324/158 P |
| 4,791,363 | 12/1988 | Logan | 324/158 P |
| 4,888,550 | 12/1989 | Reid | 324/158 P |
| 4,894,612 | 1/1990 | Drake et al. | 324/158 P |
| 5,334,931 | 8/1994 | Clarke et al. | 324/757 |
| 5,594,358 | * 1/1997 | Ishikawa et al. | 324/762 |
| 5,729,150 | * 3/1998 | Schwindt | 324/762 |

FOREIGN PATENT DOCUMENTS

| | | |
|---|---|---|
| 288234A5 | 9/1989 | (DD). |
| 93 13 420 U | 9/1993 | (DE). |
| 196 18 717 C1 | 5/1996 | (DE). |
| WO80/00101 | 1/1980 | (EP). |

* cited by examiner

Primary Examiner—Vinh P. Nguyen
(74) Attorney, Agent, or Firm—Chernoff, Vilhauer, McClung & Stenzel, LLP

(57) ABSTRACT

A system for low-current testing of a test device includes a probing device for probing a probing site on the test device. The probing device includes a dielectric substrate having first and second sides, an elongate conductive path on the first side of the substrate, an elongate probing element connected to one end of the elongate conductive path so as to extend in a cantilevered manner beyond the substrate, and a conductive area on the second side of the substrate. The probe housing is matingly detachably engageable with the probing device. The probe housing is engaged with both a force cable that includes a force conductor surrounded by a guard conductor and a sense cable that includes a sense conductor surrounded by a guard conductor. A first coupler electrically interconnects the force conductor, the sense conductor, and the elongate conductive path on the first side of the substrate when the probing device is engaged with the probe housing. A second coupler electrically interconnects the guard conductor of the force and sense cables and the conductive area on the second side of the substrate when the probing device is engaged with the probe housing.

27 Claims, 3 Drawing Sheets

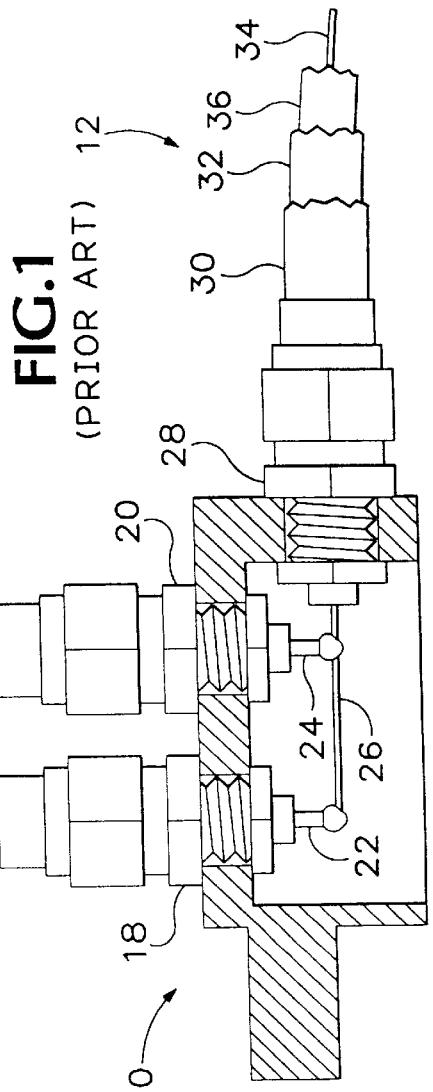
FIG.1 (PRIOR ART)
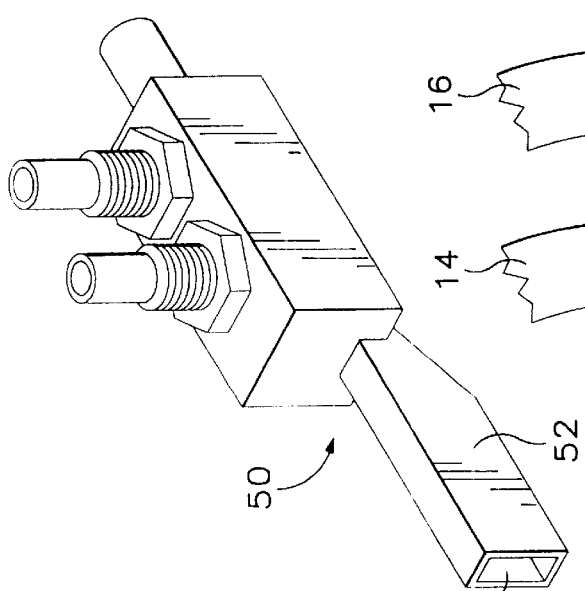
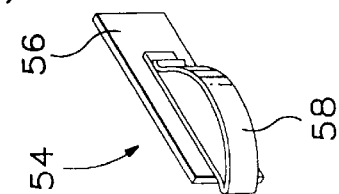
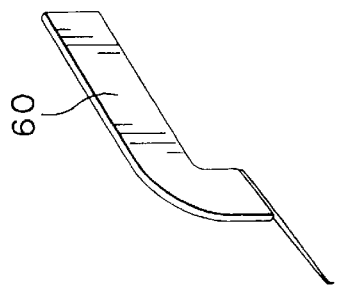
FIG.2

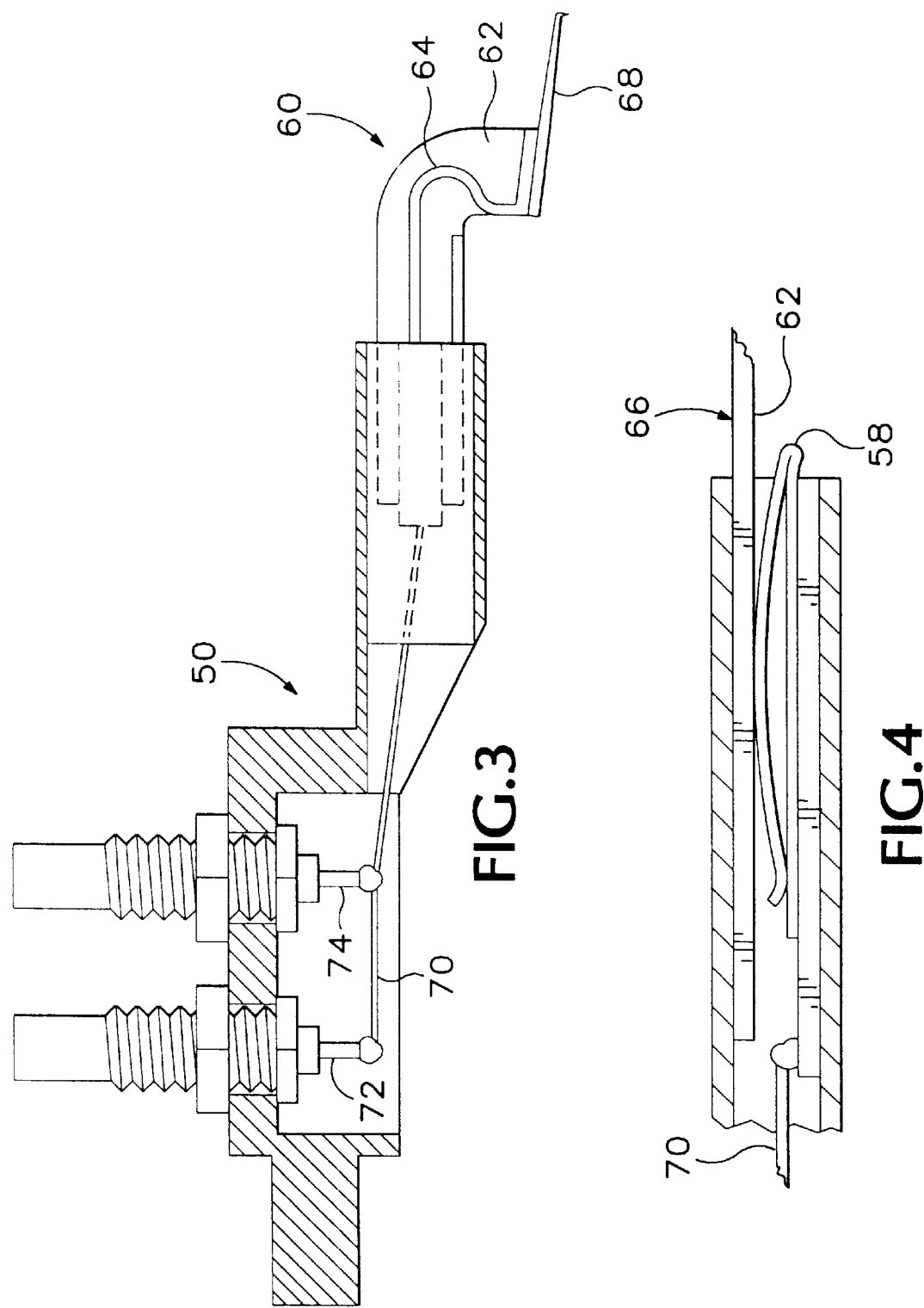

PROBE HOLDER FOR LOW CURRENT MEASUREMENTS

The present invention relates to a probe holder suitable for low current measurements.

Typically, in the construction of a probe card, a dielectric board is used as a base. A plurality of probing devices are mounted in a radial arrangement about an opening in the board so that the probing elements of these devices, which may, for example comprise slender conductive needles, terminate below the opening in a pattern suitable for probing the contact sites of the test device. The probing devices are individually connected to the respective channels of a test instrument by a plurality of interconnecting lines, where the portion of each line that extends between the corresponding probing device and the outer edge of the dielectric board may comprise an interconnecting cable or a conductive trace pattern formed directly on the board. In one conventional type of setup where the test devices are integrated circuits formed on a semiconductor wafer, the probe card is mounted by a supporting rig or test head above the wafer, and a support beneath the wafer moves the wafer so that each device thereon is consecutively brought into contact with the needles or probing elements of the probe card.

With particular regard to probe cards that are specially adapted for use in measuring ultra-low current (down to the femtoamp region or lower), probe card designers have been concerned with developing techniques for eliminating or at least reducing the effects of leakage currents, which are unwanted currents that can flow into a particular cable or channel from surrounding cables or channels so as to distort the current measured in that particular cable or channel. For a given potential difference between two spaced apart conductors, the amount of leakage current that will flow between them will vary depending upon the volume resistivity of the insulating material that separates the conductors, that is, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing interchannel leakage currents is surrounding the inner core of each lead-in wire with a cylindrical "guard" conductor, where the "guard" conductor is maintained at the same potential as the inner core by a feedback circuit in the output channel of the test instrument. Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors, unlike the inner conductive cores, are at low impedance. By using this guarding technique, significant improvement may be realized in the low-level current measuring capability of certain probe card designs.

To further improve low-current measurement capability, probe cards have been constructed so as to minimize leakage current between the individual probing devices which mount the probing needles or other elements. With respect to these devices, higher-resistance insulating materials have been substituted for lower resistance materials and additional conductive surfaces have been arranged about each device in order to perform a guarding function in relation thereto. In one type of assembly, for example, each probing device is constructed using a thin blade of ceramic material, which is a material known to have a relatively high volume resistivity. An elongate conductive trace is provided on one side of the blade to form the signal line and a backplane conductive surface is provided on the other side of the blade for guarding purposes. The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in a radial arrangement about the opening in the card so that the needles terminate within the opening in a pattern suitable for probing the test device. The conductive backplane on each blade is connected to the guard conductor of the corresponding cable and also the corresponding conductive pad or "land" adjacent the opening in the card. In this manner each conductive path is guarded by the backplane conductor on the opposite side of the blade and by the conductive land beneath it.

It has been found, however, that even with the use of guarded cables and ceramic probing devices of the type just described, the level of undesired background current is still not sufficiently reduced as to match the capabilities of the latest generation of commercially available test instruments, which instruments are able to monitor currents down to one femtoamp or less. Thus, it was evident that other changes in probe card design were needed in order to keep up with the technology of the latest test instrument design.

However, in the design of such probe cards the ceramic blades are permanently mounted to the probe card and thus when damaged the entire probe card may need to be replaced or the damaged ceramic blade somehow repaired at substantial expense and effort. Referring to FIG. 1, in order to provide probe tips that are more easily replaced, a probe housing 10 with a replaceable probe tip 12 was designed. A pair of triaxial cables (not shown), each of which includes a shield, a guard, and a signal conductor, extend from measurement equipment (not shown) to a location within a chamber (not shown) that encloses the probe tip 12, the probe housing 10, and the test device. Each triaxial cable is connected to a respective coaxial cable 14 and 16 that includes a guard and a signal conductor. The shield conductor of each of the triaxial cables may be connected to the chamber, if desired. The chamber environment is shielded so it is unnecessary to include the shield conductors all the way to the probe housing 10. In addition, the probe housing 10 includes relatively small connectors which are much more suitable for connection to relatively small coaxial cables 14 and 16, as opposed to relatively large triaxial cables. The probe housing 10 includes a pair of connectors 18 and 20, each of which provides a connection to a respective one of the coaxial cables 14 and 16. The guard of each of the coaxial cables 14 and 16 is electrically connected to the conductive exterior of the probe housing 10, which reduces the capacitance and leakage currents to the probe tip 12.

Ideally in a two lead coaxial cable system a "true Kelvin" connection is constructed, although not shown in FIG. 1. This involves using what is generally referred to as a force signal and a sense signal. The signal conductor from one of the coaxial cables is considered the force conductor, while the signal conductor from the other coaxial cable is considered the sense conductor. The force conductor is brought into contact with a test pad on the wafer. The force conductor is a low impedance connection, so a current is forced through the force conductor for testing purposes. The sense conductor is a high impedance connection and is also brought into contact with the same test pad on the wafer, preferably in close proximity to the sense conductor, in order to sense the voltage. As such the current versus voltage characteristics of the test device can be obtained using the force and sense conductors.

To calibrate the "true Kelvin" connection, first an open circuit test is performed to measure the capacitance without the test pad capacitance. This is performed by picking up the probe and shorting the probe tips of the sense and force conductors together with both suspended in air. The open circuit test is difficult to perform. Second, a short circuit test is performed to measure the capacitance when the force and sense conductor tips are on the test pad. From the open circuit test and the short circuit test the cable impedance is obtained and thereafter used for offsetting during subsequent measurements. Unfortunately, calibration of a "true Kelvin" connection is difficult and time consuming to perform. Additionally, the current flowing through the force conductor is generally known but the resistance drop along the length of force conductor results in the exact voltage at its end to be unknown, therefore the measurement can be inaccurate. Further, the test pads on the test device are normally small, in order to minimize cost, which makes it difficult to position two needles on the test pad. Furthermore, using two needles requires additional space for the needles and supporting structure that may not be available when a large number of probe needles are simultaneously necessary to test a small area of the test device, such as a silicon wafer.

Referring again to FIG. 1, to permit the use of a single probe tip, which permits more tests to be simultaneously performed in a confined area, the force conductor 22 and the sense conductor 24 are electrically connected together with a combined conductor 26 within the probe housing 10. Coaxial cable 14 would be the force connection while cable 16 would be the sense connection. The guard conductor of the force cable 14 and the guard conductor of the sense cable 16 are electrically connected to the conductive probe housing 10. The combined force and sense conductor 26 is electrically connected to a probe connector 28 at one end of the probe housing 10. A rigid coaxial probe tip cable 30 is detachably connected to the probe connector 28. The rigid coaxial probe tip cable 30 includes both a copper guard conductor 32 plated with gold and a central signal conductor 34 made of tungsten. The guard conductor 32 of the rigid coaxial probe tip cable 30 is electrically connected to the probe housing 10, which is in turn connected to the guard conductors of the coaxial cables 14 and 16. The length of the signal path extending from the point that the force conductor 22 and sense conductor 24 are connected together carries current during measurements which results in a voltage drop from any internal resistance in that portion of the signal path. The assumption is that for low current applications, the voltage drop due to the resistance is small because the junction is close to the probe tip 12 and the conductor has low resistance. However, the rigid coaxial probe tip cable 30 is difficult to replace if defective or damaged during use. The test device shown in FIG. 1, provides reasonably accurate low current measurements. Unfortunately, it was observed that the device shown in FIG. 1, when used over a wide range of temperatures, such as −65 degrees celsius to 300 degree celsius, results in unacceptable levels of noise. For example, in one commercial embodiment, noise in the range of +−100 femtoamps was observed over only a temperature range from room temperature to 150 degrees celsius. As previously mentioned, modern measurement instruments are capable of measuring much lower current levels and thus such noise levels obscures low current measurement levels under 10 femtoamps.

What is desired, therefore, is a low current measurement device that has substantially lower noise levels. In addition, such a measurement device should be provide for easy replacement of probe tips.

SUMMARY OF THE PRESENT INVENTION

The present invention overcomes the aforementioned drawbacks of the prior art by providing a system for low-current testing of a test device that includes a probing device for probing a probing site on the test device. The probing device includes a dielectric substrate having first and second sides, an elongate conductive path on the first side of the substrate, an elongate probing element connected to one end of the elongate conductive path so as to extend in a cantilevered manner beyond the substrate, and a conductive area on the second side of the substrate. The probe housing is matingly detachably engageable with the probing device which permits simple replacement of damaged probing devices. The probe housing is engaged with both a force cable that includes a force conductor surrounded by a guard conductor and a sense cable that includes a sense conductor surrounded by a guard conductor. A first coupler electrically interconnects the force conductor, the sense conductor, and the elongate conductive path on the first side of the substrate when the probing device is engaged with the probe housing. A second coupler, which is preferably the probe housing, electrically interconnects the guard conductor of the force and sense cables and the conductive area on the second side of the substrate when the probing device is engaged with the probe housing.

The system for low current measurement of the present invention provides a structure that is not subject to the generation of triboelectric currents and further is free from materials that deform over a normal range of temperatures used during probing. In addition, the probing devices are readily replaceable if damaged during use.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1 is a sectional view of a conventional probe housing and cable type probing device.

FIG. 2 is a pictorial view of an exemplary embodiment of a probe housing with a probe connector, and probing device of the present invention.

FIG. 3 is a sectional view of the probe housing and probing device engaged within the probe connector of FIG. 1.

FIG. 4 is a sectional view of the probe connector and probing device of FIG. 1.

DETAILED DESCRIPTION OF THE PREFERRED EMBODIMENT

Figure 5:
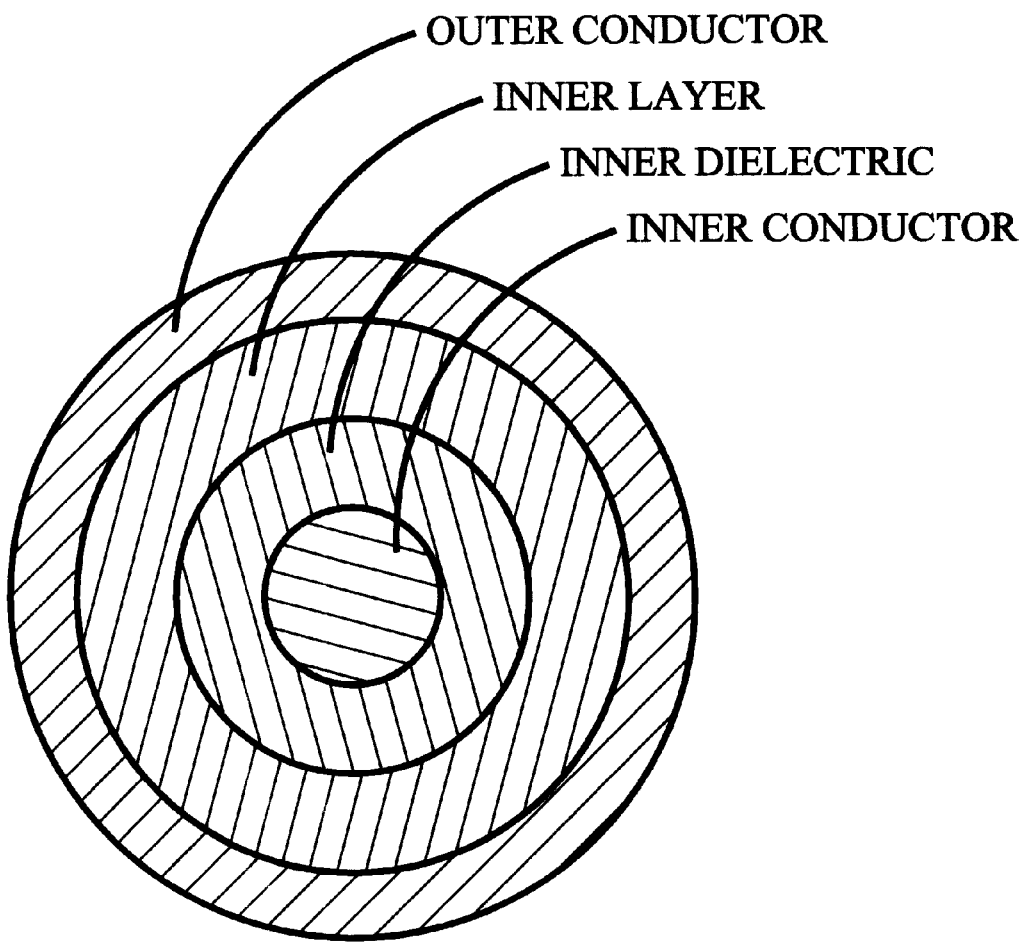
FIG. 5 is an exemplary embodiment of low-noise cable.

After observing excessive noise levels over wide temperature ranges resulting from the device shown in FIG. 1, the present inventor came to the startling realization that a Teflon insulator 36 between the signal conductor 34 and the guard conductor 32 of the coaxial probe tip cable 30 expands and contracts when the temperature is increased and decreased, respectfully. The expansion and contraction of the Teflon insulator 36 results in relative movement and friction with respect to the signal conductor 34 and the guard conductor 32. The relative movement generates electrical charges between both the guard conductor 32 and the signal conductor 34 in contact with the Teflon insulator 36 due to friction. Free electrons rub off the signal conductor 32 and the guard conductor 34 which creates a charge imbalance resulting in a current flow.

Triboelectric currents are traditionally considered to arise in relation to the physical bending of materials, such as coaxial cables. The time during which the coaxial cable undergoes physical bending is relatively long, e.g. low frequency, and does not significantly contribute to the triboelectric current generation. The present inventor believes that instead of the physical bending resulting in the major source of the generation of triboelectric currents, it is in fact a much more subtle phenomena involving the slight contraction and expansion of the Teflon insulator that creates the frictional movement previously described, and hence the undesired triboelectric current generation.

With the identification of the source of the noise, which had not been previously identified by previous probe card designers, the present inventor developed ingenious solutions to the identified problem.

In order to reduce the triboelectric current generation, the cable 30 is replaced with "low-noise" cable. "Low-noise" cable, greatly reduces triboelectric currents by typically using an inner insulator of polyethylene coated with graphite. The graphite provides lubrication and a conduction equipotential cylinder to equalize charges and minimize charges generated by frictional effects of cable movement.

It will be noted that the inventor does not claim to have discovered a new solution to the problem of the triboelectric effect as embodied by the use of "low-noise" cable. A relatively straightforward solution to this problem can be found in the field of cable technology wherein it is known how to construct a "low-noise" cable by using an additional layer of material between the outer conductor and the inner insulator as shown in FIG. 5, which material is of suitable composition for suppressing the triboelectric effect. This layer, in particular, includes a nonmetallic portion that is physically compatible with the inner insulator so as to be prevented from rubbing excessively against this dielectric and, on the other hand, includes a portion that is sufficiently conductive that it will immediately dissipate any charge imbalance that may be created by free electrons that have rubbed off the conductor. It is not claimed by the inventor that this particular solution to the triboelectric effect problem is his invention. Rather it is the recognition that this specific problem is a major source of performance degradation in the field of low-current probe station design, and in particular degradation when testing over a range of temperatures, that the inventor regards as his discovery.

As previously described, one embodiment of a probe holder design of the present invention includes the replacement of cable 30 with a "low-current" cable that includes conductive and dielectric layers in a coaxial arrangement with each other and further includes at least one layer of material within each cable adapted for suppressing the triboelectric effect so as to minimize any undesirable currents that would otherwise be generated internally in each cable due to this effect. This layer of material on the probe holder enables the probe station to be used for the measurement of ultra-low currents even over a range of temperatures.

In the field of radio frequency (rf) cable technology, cables that include a layers material of the type just described are generally referred to as "low-noise" cables. Commercial sources for this type of cable include Belden Wire and Cable Company based in Richmond, Ind., Suhner HR-Kabel based in Herisau, Switzerland, and Times Microwave Systems based in Wallingford, Conn.

While the replacement of the cable 30 with "low-noise" cable significantly enhances the low-noise characteristics of the device 10, the cable is expensive to obtain in small quantities, awkward to replace in a confined environment if damaged, and the precise bending of the cable to the test pad together with the precise location of the probe tip is difficult to control with a cable type connector. Even more importantly, the Teflon insulator material in coaxial cables are susceptible to "cold flow" out of the end of the cable when subjected to significant temperatures. The resulting cable insulator will be thinner in portions thereby changing the characteristics of the cable over time.

Referring to FIG. 2, in order to overcome the limitations of cable type connectors, an alternative embodiment includes a conductive probe housing 50, similar in structure to the probe housing 10 shown in FIG. 1, with an elongate probe connector 52. The probe connector 52 is conductive and preferably has a rectangular cross section. An insert 54 is sized to fit within the probe connector 52. The insert 52 includes a ceramic insulator 56 and a conductive bent connector 58 attached to one side of the insulator 56. The insulator 56 is in face-to-face abutment with the interior upright surface 59 of the probe connector 52. A "blade" type probe 60, as described in the background, is matingly detachably engageable within the probe connector 52.

Referring also to FIG. 3, the blade 60 preferably includes a dielectric substrate 62 formed of a ceramic or a comparable high-resistance insulating material. The blade 60 has a pair of broad parallel sides or faces interconnected by a thin edge. Formed on one side of the blade 60 is an elongate conductive path 64, while the other side includes a backplane conductive surface 66. A needle 68 is supported by the dielectric substrate 62 and electrically connected to the elongate conductive path 64. In the particular embodiment shown, the blade 60 is generally L-shaped in profile and is edge-mounted within the probe connector 52 so that the short arm of the L-shaped blade 60 extends downwardly making contact with the test device. As previously indicated, blades 60 having a construction of the type just described are commercially available from Cerprobe Corporation of Tempe, Ariz.

Referring also to FIG. 4, when the blade 60 is slidably engaged within the probe connector 52, the backplane conductive surface 66 is in face-to-face contact with the inner upright surface 59 of the probe connector 52. Accordingly, a ground signal path is provided from the guard conductors of the force and sense cables 14 and 16, though the probe housing 50 and probe connector 52 to the backplane conductive area 66 of the blade 60. This provides a ground path to a location near the end of the needle 68. In addition, a conductive path is provided from force and sense conductors 72 and 74 connected to cables 14 and 16, through a combined conductor 70 to the bent connector 58. It is to be understood that the combined connector 70 may be any suitable type of coupler that electrically connects the force and sense cables to the conductive path 64 on the blade 60. Likewise it is to be understood that the electrical connection between the backplane 66 on the blade 60 and the cables 14 and 16 may be any suitable type of coupler. The bent connector 58 is resiliently deformable as the blade 60 is inserted into the probe connector 52 and exerts pressure between the backplane conductive surface 66 and the upright surface 59 so a low loss connection is maintained. Also the pressure maintains the position of the blade 60 during use. Simultaneously, the bent connector 58 exerts pressure between the conductive path 64 and the bent connector 58 to provide a low loss connection. A signal path is thus provided through the needle 68, the conductive path 64, the bent connector 58, and the combined conductor 70 to the force conductor 72 and sense conductor 74.

The probe embodiment shown in FIGS. 2–4 does not include structure that is subject to the generation of triboelectric currents and further is free from materials that deform over a normal range of temperatures used during probing. In addition, the blades 60 are readily replaceable if damaged during use.

While the preferred embodiment of the present invention embodies a set of two cables 14 and 16, with one including the sense conductor and the other including the force conductor, it is to be understood that the present invention also encompasses a probe holder with a single coaxial, or triaxial, cable.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A system for low-current testing of a test device comprising:
   (a) a probing device for probing a probing site on said test device, said probing device including a dielectric substrate having first and second sides, an elongate conductive path on said first side of said substrate, an elongate probing element connected to one end of said elongate conductive path so as to extend in a cantilevered manner beyond said substrate, and a conductive area on said second side of said substrate;
   (b) a probe housing matingly detachably engageable with said probing device;
   (c) said probe housing being engaged with both a first cable that includes a first conductor surrounded by a second conductor and a second cable including a third conductor surrounded by a fourth conductor;
   (d) a coupler electrically interconnects said first conductor, said third conductor, and said elongate conductive path on said first side of said substrate when said probing device is engaged with said probe housing; and
   (e) said probe housing electrically interconnects, at least in part, said second conductor with and said fourth conductor with said conductive area on said second side of said substrate when said probing device is engaged with said probe housing.

2. The system of claim 1 wherein said probe housing further includes an elongate opening in which said probing device is matingly detachably engageable therewith.

3. The system of claim 2 wherein said opening defines a first upright surface therein.

4. The system of claim 3 wherein said conductive area is in face-to-face contact with said first upright surface when said probing device is engaged with said probe housing.

5. The system of claim 4 wherein said system further comprises an insert within said probe housing that includes an insulator in face-to-face abutment with a second upright surface opposing said upright surface and a conductive member that is in connection with said elongate conductive path.

6. The system of claim 5 wherein said conductive member is resiliently deformable as said probing device is said detachably engageable with said probing device.

7. A system for low-current testing of a test device comprising:
   (a) a probing device for probing a probing site on said test device, said probing device including a dielectric substrate having first and second sides, an elongate conductive path on said first side of said substrate, an elongate probing element connected to one end of said elongate conductive path so as to extend in a cantilevered manner beyond said substrate, and a conductive area on said second side of said substrate;
   (b) a probe housing matingly detachably engageable with said probing device;
   (c) said probe housing being detachably engageable with both a first cable that includes a first conductor surrounded by a second conductor and a second cable that includes a third conductor surrounded by a fourth conductor;
   (d) a coupler that electrically interconnects said first conductor, said third conductor, and said elongate conductive path on said first side of said substrate when said probing device is engaged with said probe housing, said first cable is engaged with said probe housing, and said second cable is engaged with said probe housing; and
   (e) said probe housing electrically interconnects, at least in part, said second conductor and said fourth conductor with said conductive area on said second side of said substrate when said probing device is engaged with said probe housing.

8. The system of claim 7 wherein said probe housing further includes an elongate opening in which said probing device is matingly detachably engageable therewith.

9. The system of claim 8 wherein said opening defines a first upright surface therein.

10. The system of claim 9 wherein said conductive area is in face-to-face contact with said first upright surface when said probing device is engaged with said probe housing.

11. The system of claim 10 wherein said system further comprises an insert within said probe housing that includes an insulator in face-to-face abutment with a second upright surface opposing said upright surface and a conductive member that is in connection with said elongate conductive path.

12. The system of claim 11 wherein said conductive member is resiliently deformable as said probing device is said detachably engageable with said probing device.

13. A probe housing for holding a test device comprising:
   (a) said probe housing matingly detachably engageable with a probing device for probing a probing site on said test device that includes a dielectric substrate having first and second sides, an elongate conductive path on said first side of said substrate, an elongate probing element connected to one end of said elongate conductive path so as to extend in a cantilevered manner beyond said substrate, and a conductive area on said second side of said substrate;
   (b) said probe housing being detachably engageable with both a first cable that includes a first conductor surrounded by a second conductor and a second cable that includes a third conductor surrounded by a fourth conductor;
   (c) a coupler that electrically interconnects said first conductor, said third conductor, and said elongate conductive path on said first side of said substrate when said probing device is engaged with said probe housing, said first cable is engaged with said probe housing, and said second cable is engaged with said probe housing; and
   (d) said probe housing electrically interconnects, at least in part, said second conductor and said fourth conductor with said conductive area on said second side of said substrate when said probing device is engaged with said probe housing.

14. The system of claim 13 wherein said probe housing further includes an elongate opening in which said probing device is matingly detachably engageable therewith.

15. The system of claim 14 wherein said opening defines a first upright surface therein.

16. The system of claim 15 wherein said conductive area is in face-to-face contact with said first upright surface when said probing device is engaged with said probe housing.

17. The system of claim 16 wherein said system further comprises an insert within said probe housing that includes an insulator in face-to-face abutment with a second upright surface opposing said upright surface and a conductive member that is in connection with said elongate conductive path.

18. The system of claim 17 wherein said conductive member is resiliently deformable as said probing device is said detachably engageable with said probing device.

19. A system for low-current testing of a test device comprising:
   (a) a probe housing matingly detachably engageable with a probing device for probing a probing site on said test device, said probing device includes an inner conductor, an inner dielectric, and an outer conductor, said probing device further including an inner layer of material between said inner dieletric and said outer conductor of suitable composition for reducing triboelectric current generation between said inner dielectric and said outer conductor to less than that which would occur were said inner dielectric and said outer conductor to directly adjoin each other;
   (b) said probe housing being detachably engageable with both a first cable that includes a first conductor surrounded by a second conductor and a second cable that includes a third conductor surrounded by a fourth conductor;
   (c) a coupler that electrically interconnects said first conductor, said third conductor, and said inner conductor when said probing device is engaged with said probe housing, said first cable is engaged with said probe housing, and said second cable is engaged with said probe housing; and
   (d) said probe housing electrically interconnects, at least in part, said fourth conductor, said second conductor, and said outer conductor when said probing device is engaged with said probe housing, where said coupler is electrically isolated from said probe housing.

20. A system for low-current testing of a test device comprising:
   (a) a probing device for probing a probing site on said test device, said probing device including a dielectric substrate having first and second sides, an elongate conductive path on said first side of said substrate, an elongate probing element connected to one end of said elongate conductive path so as to extend in a cantilevered manner beyond said substrate, and a conductive area on said second side of said substrate;
   (b) a probe housing matingly detachably engageable with said probing device;
   (c) said probe housing being detachably engageable with at least a first cable that includes a first conductor surrounded by a second conductor;
   (d) a coupler electrically interconnects said first conductor and said elongate conductive path on said first side of said substrate when said probing device is engaged with said probe housing, and said first cable is engaged with said probe housing; and
   (e) said probe housing electrically interconnects, at least in part, said second conductor with said conductive area on said second side of said substrate when said probing device is engaged with said probe housing, where said coupler is electrically isolated from said probe housing.

21. The system of claim 20 wherein said probe housing further includes an elongate opening in which said probing device is matingly detachably engageable therewith.

22. The system of claim 21 wherein said opening defines a first upright surface therein.

23. The system of claim 22 wherein said conductive area is in face-to-face contact with said first upright surface when said probing device is engaged with said probe housing.

24. The system of claim 23 wherein said system further comprises an insert within said probe housing that includes an insulator in face-to-face abutment with a second upright surface opposing said upright surface and a conductive member that is in connection with said elongate conductive path.

25. The system of claim 24 wherein said conductive member is resiliently deformable as said probing device is said detachably engageable with said probing device.

26. The system of claim 20 further comprising:
   (a) said probe housing being detachably engageable with a second cable that includes a third conductor surrounded by a fourth conductor;
   (b) said coupler electrically interconnects said third conductor and said elongate conductive path on said first side of said substrate when said probing device is engaged with said probe housing and said second cable is engaged with said probe housing; and
   (c) said probe housing electrically interconnects said fourth conductor with said conductive area on said second side of said substrate when said probing device is engaged with said probe housing.

27. A system for low-current testing of a test device comprising:
   (a) a probe housing matingly detachably engageable with a probing device for probing a probing site on said test device, said probing device includes an inner conductor, an inner dielectric, and an outer conductor, said probing device further including an inner layer of material between said inner dielectric and said outer conductor of suitable composition for reducing triboelectric current generation between said inner dielectric and said outer conductor to less than that which would occur were said inner dielectric and said outer conductor to directly adjoin each other;
   (b) said probe housing being detachably engageable with at least a cable that includes a first conductor surrounded by a second conductor;
   (c) a coupler electrically interconnects said first conductor and said inner conductor when said probing device is engaged with said probe housing, said cable is engaged with said probe housing; and
   (d) said probe housing, at least in part, electrically interconnects said second conductor with said outer conductor when said probing device is engaged with said probe housing, where said coupler is electrically isolated from said probe housing.

* * * * *